United States Patent
Abramovici et al.

(10) Patent No.: US 6,550,030 B1
(45) Date of Patent: Apr. 15, 2003

(54) ON-LINE TESTING OF THE PROGRAMMABLE LOGIC BLOCKS IN FIELD PROGRAMMABLE GATE ARRAYS

(75) Inventors: Miron Abramovici, Berkeley Heights, NJ (US); Charles E. Stroud, Lexington, KY (US)

(73) Assignee: Lattice Semiconductor Corp., Hillsboro, OR (US)

( * ) Notice: Subject to any disclaimer, the term of this patent is extended or adjusted under 35 U.S.C. 154(b) by 0 days.

(21) Appl. No.: 09/405,958

(22) Filed: Sep. 27, 1999

(51) Int. Cl.$^7$ .............................................. H04B 17/00
(52) U.S. Cl. ........................ 714/725; 714/738; 714/734
(58) Field of Search ............................... 714/725, 724, 714/733, 734, 738

(56) References Cited

U.S. PATENT DOCUMENTS

| | | | |
|---|---|---|---|
| 4,594,711 A | * | 6/1986 | Thatte |
| 4,757,503 A | | 7/1988 | Hayes et al. |
| 5,051,996 A | | 9/1991 | Bergeson et al. |
| 5,107,208 A | | 4/1992 | Lee |
| RE34,445 E | | 11/1993 | Hayes et al. |
| 5,260,946 A | | 11/1993 | Nunally |
| 5,278,841 A | | 1/1994 | Myers |
| 5,347,519 A | | 9/1994 | Cooke et al. |
| 5,425,036 A | | 6/1995 | Liu et al. |
| 5,430,734 A | | 7/1995 | Gilson |
| 5,488,612 A | | 1/1996 | Heybruck |
| 5,508,636 A | | 4/1996 | Mange et al. |
| 5,623,501 A | | 4/1997 | Cooke et al. |
| 5,991,907 A | * | 11/1999 | Stroud et al. ............... 714/725 |

OTHER PUBLICATIONS

G. Gibson Et Al., "Boundary–Scan Access of Built in Self Test for Field Programmabl Gate Arrays," Proc. IEEE Internationa ASIC Conf. pp. 57–61, Sep. 7–10, 1997.

(List continued on next page.)

Primary Examiner—Phung M. Chung

(57) ABSTRACT

A method of self-testing the programmable logic blocks of field programmable gate arrays (FPGAs) during normal on-line operation includes configuring the FPGA into an initial self-testing area and a working area. The self-testing area may be further subdivided into self-testing tiles for concurrent testing if desired. The programmable logic blocks located within the self-testing area or self-testing tiles are established to function as a test pattern generator, an output response analyzer, and equivalently configured programmable logic blocks under test for testing. An exhaustive set of test patterns generated by the test pattern generator are applied to the programmable logic blocks under test which are repeatedly reconfigured in order to completely test the programmable logic blocks in all possible modes of operation. The outputs of the logic blocks are compared by the output response analyzer and resultant fault status data for each programmable logic block under test is received by a controller in communication with a memory for storing usage and fault status data for each programmable logic block. After testing each logic block in the initial self-testing area, the FPGA is reconfigured such that a portion of the working area becomes a subsequent self-testing area and at least a portion of the initial self-testing area replaces that portion of the working area. In other words, the self-testing area roves around the FPGA repeating the steps of testing and reconfiguring the programmable logic blocks until the entire FPGA has undergone testing or continuously.

29 Claims, 4 Drawing Sheets

OTHER PUBLICATIONS

C. Stroud Et Al., "Evaluation of FPGA Resources for Built in Self Test of Programmable Logic Blocks," Proc ACM/SIGDA Inter. Symp. on FPGAS PP 107–113, 1996.

C. Stroud Et Al., "Built in Self Test for Programmable Logis Blocks in FPGA," Proc. IEEE VLSI Test Symp, PP 387–392, Apr. 28–May 1, 1996.

C. Stroud Et Al., "Using ILA Testing for BIST in FPGAS," Proc IEEE International Test Conf., PP 68–75, Oct. 20–25, 1996.

C. Stroud Et Al., "BIST Based Diagnostics for FGPA Logic Blocks," Proc. IEEE International Test Conf., PP 539–547, Nov. 1–6, 1997.

N. Shnidman Et Al., "On–Line Fault Detection for Bus–Based Field Programmable Gate Arrays," IEEE Transactions on VLSI Systems, vol. 6, No. 4, Dec., 1998.

L. Shombert Et Al., "Using Redundancy for Concurrent Testing and Repairing of Systolic Arrays," Proc. 17th Fault–Tolerant Computing Symp., 1987.

* cited by examiner

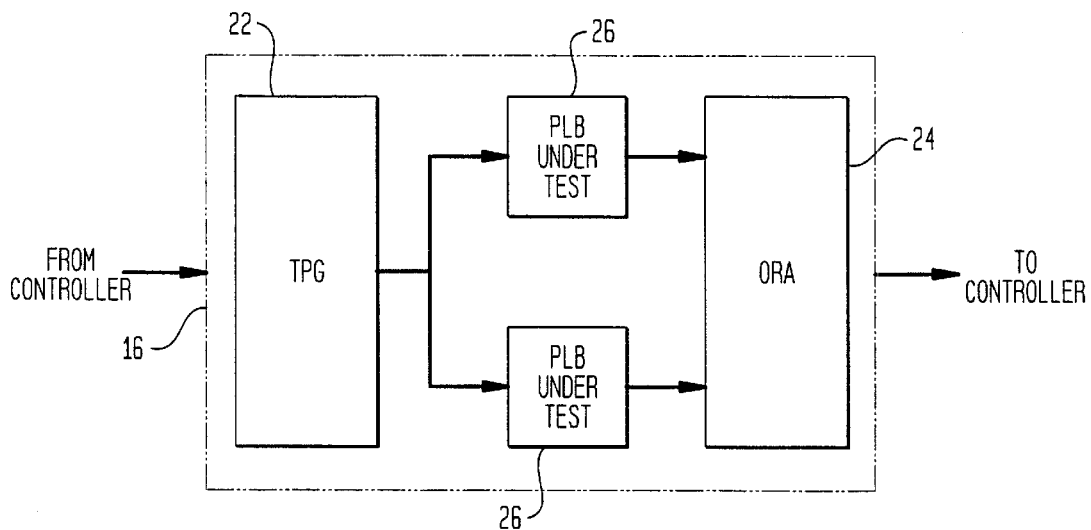
FIG. 4
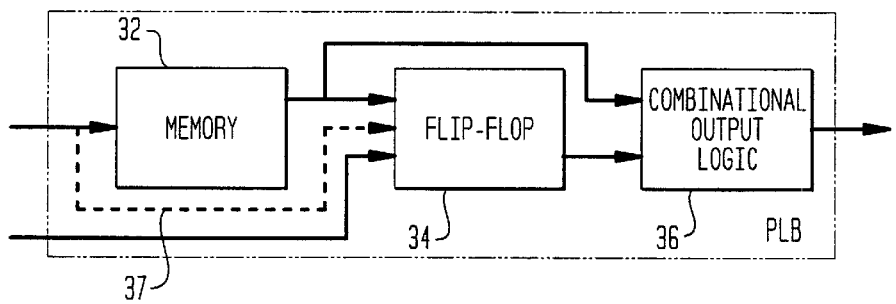
FIG. 5
FIG. 6A
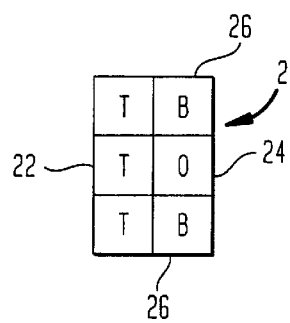
FIG. 6B
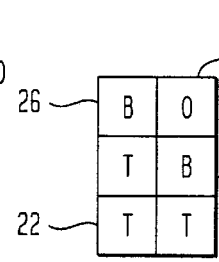
FIG. 6C
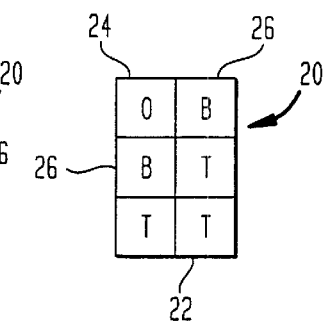

ON-LINE TESTING OF THE PROGRAMMABLE LOGIC BLOCKS IN FIELD PROGRAMMABLE GATE ARRAYS

TECHNICAL FIELD

The present invention relates generally to the field of testing of integrated circuit devices and, more particularly, to a method of testing the programmable logic blocks in a field programmable gate array.

BACKGROUND OF THE INVENTION

A field programmable gate array (FPGA) is a type of integrated circuit consisting of an array of programmable logic blocks interconnected by a programmable routing network and programmable input/output cells. Programming of the logic blocks, the routing network and the input/output cells is selectively completed to make the necessary interconnections that establish one configuration thereof to provide the desired system operation/function for a particular application.

The present inventors have recently developed methods of built-in self-testing the array of programmable logic blocks and the programmable routing network in FPGAs at the device, board and system levels. These methods are set out in detail in pending U.S. patent application Ser. No. 08/729,117 now U.S. Pat. No. 5,991,907, Ser. No. 08/595,729 now abandoned and Ser. No. 09/109,123 now U.S. Pat. No. 6,202,182. The full disclosures in these patent applications are incorporated herein by reference.

In each of these prior methods, the reprogrammability of an FPGA is exploited so that the FPGA is configured exclusively with built-in self-test (BIST) logic during off-line testing and subsequently reconfigured to its normal operating configuration. In this way, testability at every level is achieved without overhead. In other words, the BIST logic simply "disappears" when the FPGA is reconfigured for its normal system function.

In addition to these off-line testing methods, the present inventors have also recently developed methods of testing and fault tolerant operation of the programmable logic blocks of FPGAs. These methods are set out in detail in pending U.S. patent application Ser. No. 09/261,776 now U.S. Pat. No. 6,256,758. The full disclosure in this patent application is also incorporated herein by reference.

Fault tolerant operation of FPGAs is most important in high-reliability and high-availability applications, such as, space missions or telecommunication network routers in which adaptive computing systems often rely on reconfigurable hardware to adapt system operation. In such applications, the FPGA hardware must work continuously and simply cannot be taken off-line for testing, maintenance, or repair.

When faults are detected and located in the FPGA hardware of these systems, the FPGA resources must be quickly reconfigured to continue operation in a diminished capacity or to avoid the identified faulty resources altogether. Necessarily, therefore, testing of the FPGA resources must be performed concurrently with normal system operation.

SUMMARY OF THE INVENTION

In accordance with the present invention, the method of testing field programmable gate arrays is carried out during normal on-line operation of the FPGA by configuring the FPGA resources into a working area and an initial self-testing area. The working area maintains normal operation of the FPGA throughout testing. Within the initial and subsequent self-testing areas, however, the programmable logic blocks are each tested, and their utilization adjusted, if required. Advantageously, the working area is substantially unaffected by testing, and testing time constraints are reduced since normal operation continues in the working area.

Within the self-testing areas, test patterns are generated and applied to each programmable logic block selected as a block under test. The output patterns of the selected programmable logic block under test are preferably compared to output patterns produced by an equivalently configured programmable logic block within the self-testing area receiving the same test patterns. This method is similar to the BIST techniques described in detail in the above noted pending patent applications incorporated herein by reference.

Based on the comparison of the output patterns of the logic blocks under test, fault status data is generated. Based on the fault status data, partially faulty programmable logic blocks are reconfigured to perform a non-faulty function of the logic block and further utilized. By reconfiguring partially faulty programmable logic blocks to avoid all functions or operational modes affected by the detected fault, the partially faulty logic blocks are allowed to continue to operate in a progressively diminished, although acceptable, capacity for specific operating modes. This type of testing and fault tolerant operation is described in detail in the above noted pending patent application incorporated herein by reference.

In accordance with an important aspect of the present invention, the initial self-testing area of the FPGA may be further divided into self-testing tiles. Specifically, the self-testing area may be divided into any number of equivalently configured self-testing tiles so long as each tile contains a sufficient amount of FPGA resources to complete testing. Advantageously, this allows concurrent testing of several tiles within the self-testing area, thus reducing the overall test time and fault latency.

Another important aspect of the present inventive method provides for the repeated reconfiguring of the programmable logic blocks within the self-testing area or self-testing tiles so that each logic block becomes a logic block under test at least once during testing. Preferably, the functions of the programmable logic blocks within the self-testing area, i.e., test pattern generator, output response analyzer, programmable logic block under test, and possibly spare programmable logic block, are systematically rotated during testing. In this manner, each programmable logic block is compared to at least two different programmable logic blocks during testing thus substantially eliminating the possibility of faulty blocks passing the tests.

Upon completion of testing of each of the programmable logic blocks located within the initial self-testing area, the FPGA is reconfigured so that a portion of the working area becomes a subsequent self-testing area, and the initial self-testing area becomes a portion of the working area. In other words, the self-testing area roves around the FPGA repeating the steps of testing and reconfiguring the programmable logic blocks in the self-testing areas until each portion of the working area, or the entire FPGA, is reconfigured as a subsequent self-testing area, tested, and its programmable logic blocks reconfigured. Advantageously, normal operation of the FPGA continues within the working area throughout testing and is uninterrupted by the testing conducted within the self-testing areas.

The steps of configuring, testing, and reconfiguring each programmable logic block under test, storing the subsequent fault status data, and roving the self-testing area around the FPGA under test for further testing are necessarily controlled by a test and reconfiguration controller and an associated storage medium. In operation, the test and reconfiguration controller accesses the FPGA during normal system operation and configures the FPGA with one of a plurality of test configurations stored in the associated storage medium.

As described above, a test pattern generator configured within the self-testing area or within each self-testing tile provides the necessary test patterns dependent upon the function or mode of operation of the programmable logic block under test. The output patterns of the programmable logic block under test are preferably compared to output patterns produced by an equivalently configured programmable logic block under test receiving identical test patterns.

The test and reconfiguration controller further repeatedly reconfigures the programmable logic blocks under test for testing in all possible modes of operation. The results of the test pattern comparisons for each mode of operation of the logic blocks under test along with the intended functional usage data for the blocks under test are stored in the storage medium. The intended functional usage data may be extracted at the design stage, or may be obtained utilizing a configuration decompiler which extracts the data from the configuration stream. In order to facilitate the subsequent fault tolerant reconfiguration and further operation of the programmable logic blocks under test, the results for each mode of operation are associated with the usage data for the programmable logic blocks under test.

BRIEF DESCRIPTION OF THE DRAWINGS

The accompanying drawings incorporated in and forming a part of the specification, illustrate several aspects of the present invention and together with the description serve to explain the principles of the invention. In the drawings:

FIG. 4 is a schematic block diagram showing a preferred comparison-based self-testing area configured to include a test pattern generator, programmable logic blocks under test, and an output response analyzer;

FIG. 5 is a schematic block diagram of a typical programmable logic block of a field programmable gate array;

FIGS. 6A–6F are illustrations of a self-testing tile showing each stage of the preferred systematic rotation of the functions of the programmable logic blocks;

Reference will now be made in detail to the present preferred embodiment of the invention, an example of which is illustrated in the accompanying drawings.

DETAILED DESCRIPTION OF THE INVENTION

Figure 1:
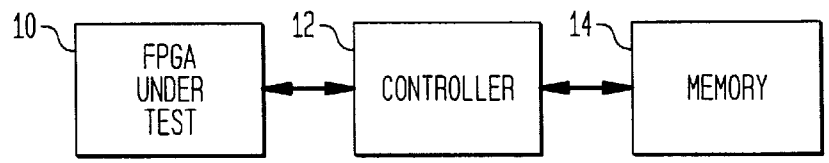
FIG. 1 is a schematic block diagram of an apparatus for testing of a field programmable gate array.

A typical field programmable gate array (FPGA) generally consists of an array of programmable logic blocks interconnected by a programmable routing network and programmable input/output cells or boundary-scan ports (most FPGAs feature a boundary-scan mechanism). Such structures are, for example, featured in the Lucent ORCA programmable function units, in the Xilinx XC4000 configurable logic block, and in the ALTERA FLEX 8000 logic element. In accordance with the method of the present invention, the programmable logic blocks of an FPGA are completely tested during normal operation. In order to test the programmable logic blocks during normal operation, the FPGA resources are configured into a working area and a self-testing area. As shown in schematic block diagram in FIG. 1, the steps of configuring, testing, reconfiguring, and roving the resources of an FPGA under test 10 are necessarily controlled by a test and reconfiguration controller 12. In the preferred embodiment, an external test and reconfiguration controller 12 is utilized because present commercially available FPGAs do not allow internal access to their configuration memory. Accordingly, a configuration decompiler tool of a type known in the art is utilized to determine the intended function or mode of operation of the FPGA resources. Alternatively, this information may be extracted from the design stage and made available to the controller 12. It should be appreciated by those skilled in the art that any controller, e.g., internal or external to the FPGA, could be utilized with an FPGA that allows for internal access to its configuration memory and that a single test and reconfiguration controller is capable of controlling several FPGAs. For purposes of illustration of the present preferred embodiment of the invention, however, a one-to-one controller to FPGA ratio is utilized.

The preferred controller 12 may be implemented on an embedded microprocessor in communication with a storage medium or memory 14 for storing the configurations and test data. In operation, the controller 12 accesses the system platform including the FPGA under test 10 through its boundary-scan ports in a known manner such that access is transparent to the normal function of the FPGA 10. Advantageously, this approach allows for complete on-line testing, and reconfiguration for fault tolerant operation during normal operation of the FPGA 10 under test. The controller 12 and memory 14 further exchange and store usage status data (e.g., functional status, unused spare status or spare status) used in testing and fault status data (e.g., fault-free status, defective status or partially usable status) for each programmable logic block tested. This data is subsequently utilized in reconfiguring the allowable functions of the programmable logic blocks under test. The utilization of the usage and fault status data is described in more detail below.

Figure 2:
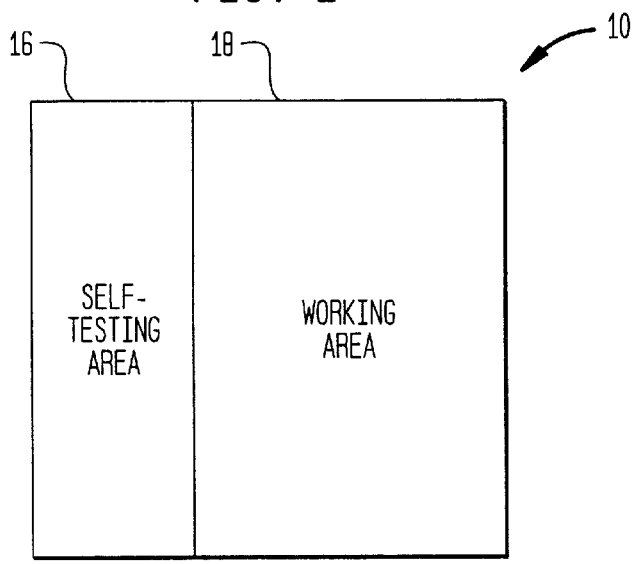
FIG. 2 is an illustration of the FPGA under test configured into an initial self-testing area and a working area wherein the working area maintains normal operation of the FPGA under test.

As shown in FIG. 2, the FPGA under test 10 is initially configured by the controller 12 into an initial self-testing area 16 and a working area 18. The working area 18 maintains normal operation of the FPGA under test 10 throughout testing. Within the initial self-testing area 16, the programmable logic blocks are each tested and their utilization reconfigured, if required.

Figure 3:
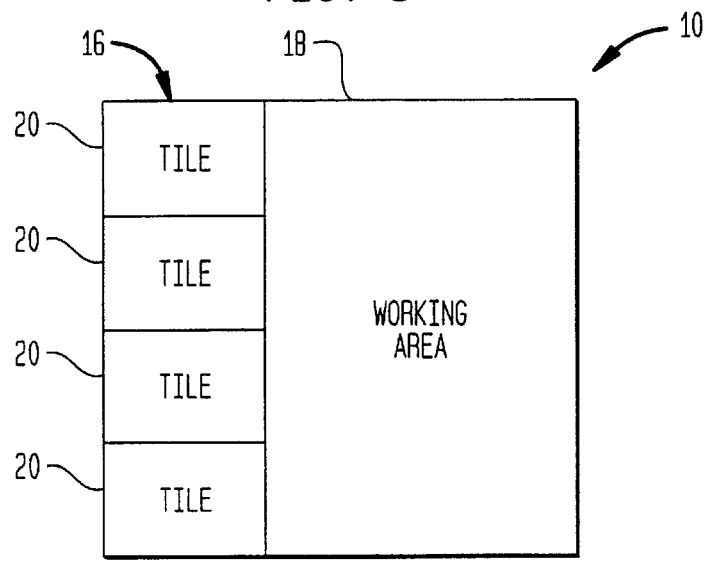
FIG. 3 is an illustration of the preferred FPGA under test with the initial self-testing area subdivided into self-testing tiles for concurrent testing.

In the present preferred embodiment shown in FIG. 3, the initial self-testing area 16 of the FPGA under test 10 may be further divided into self-testing tiles 20. Specifically, the self-testing area 16 may be divided into any number of equivalently configured self-testing tiles 20 so long as each tile 20 contains a sufficient amount of FPGA resources to complete testing. Advantageously, this allows for concurrent testing of several tiles 20 within the self-testing area 16, thus reducing the overall test time and fault latency. For purposes of illustration of the present preferred embodiment of the present invention, only the method for testing a single self-testing tile 20, i.e., an undivided self-testing area 16, will be described in detail.

As shown in FIG. 4, the programmable logic blocks within the initial self-testing area 16 are configured to include a test pattern generator (TPG) 22, an output response analyzer (ORA) 24, and equivalently configured programmable logic blocks (PLBs) under test 26. During testing, equivalent test patterns generated using the TPG 22 are received by the PLBs under test 26. The outputs of the PLBs under test 26 are compared by the ORA 24 to determine whether a fault exists within either of the PLBs under test 26. A match/mismatch result of the comparison performed by the ORA 24 is communicated as a pass/fail result or fault status data through the boundary-scan ports of the FPGA (not shown) to the controller 12. The fault status data is stored in memory 14 and utilized by the controller 12 in reconfiguring the PLB for fault tolerant operation. The operation of the TPG 22 and ORA 24 in testing the PLBs under test 26 is similar to the built-in self-test techniques utilized and described in detail in the above-noted pending U.S. patent applications.

In accordance with another aspect of the inventive method, complete testing of the PLBs under test 26 is achieved by repeatedly reconfiguring the PLBs under test 26 for testing in every possible mode of operation and applying exhaustive test patterns in each mode of operation. Without having a detailed knowledge of the implementation of the FPGA under test 10, the modes of operation of its programmable logic blocks may be determined only from the information provided in an associated FPGA data manual. In addition to repeatedly reconfiguring the PLBs under test 26, the TPG 22 is reconfigured by the controller 12 for each new mode of operation of the PLBs under test 26 which require test patterns different from the ones generated for the previous mode of operation. The ORA 24 is also reconfigured by the controller 12 when the new mode of operation of the PLBs under test 26 involves a different number of outputs. It is important to note that all of these reconfigurations occur concurrently with the normal operation of the FPGA under test 10, which is unaffected by and unaware of the testing activity.

As shown in FIG. 5, a typical programmable logic block, for example logic block under test 26, includes a memory block 32, a flip-flop block 34, and a combinational output logic block 36. The memory block 32 may be configured to operate as a random access memory (RAM) or as a combinational look-up table (LUT). In addition, combinational logic within the memory block 32 may be configured to operate as special combinational operators such as a comparator, an adder or a multiplier. As an example of the several possible configurations of a memory block 32, the memory block modes of operation and the number of corresponding outputs are summarized for an ORCA Series 2CA Programmable Logic Block in Table 1 below.

TABLE 1

| | Memory Block Modes of Operation | Number of Outputs |
|---|---|---|
| 1 | Async. RAM | 4 |
| 2 | Adder/Subtractor | 5 |
| 3 | 5-variable MUX | 4 |
| 4 | 5-variable XOR | 4 |
| 5 | Count up | 5 |
| 6 | Count up/Count down | 5 |
| 7 | Count down | 5 |
| 8 | 4-variable LUT | 4 |
| 9 | 5-variable LUT | 5 |
| 10 | Multiplier | 5 |
| 11 | >=Comparator | 5 |
| 12 | ≠Comparator | 5 |
| 13 | Sync. RAM | 4 |
| 14 | Dual port RAM | 4 |

Memory Block Modes of Operation and the Number of Corresponding Outputs for an ORCA Series 2CA Programmable Logic Block Similarly, the flip-flops in the flip-flop block 34 may operate as flip-flops or may be configured to operate as latches. In addition, other programming options dealing with synchronous and asynchronous Set and Reset, Clock Enable, etc. could be provided in association with operation as flip-flops or as latches. As an example, the several possible configurations of a flip-flop block 34, the flip-flop block modes of operation, and associated options are summarized for an ORCA Series 2CA Programmable Logic Block in Table 2 below.

TABLE 2

| | Flip-Flop/Latch Modes of Operation & Options | | | | |
|---|---|---|---|---|---|
| | FF/ Latch | Ser/Reset | Clock | Clock Enable | Flip-Flop Data In |
| 1 | FF | Asyncronous R | Falling Edge | Active Low | Programmable logic block Input |
| 2 | FF | Asyncronous S | Falling Edge | Enabled | Programmable logic block Input |
| 3 | Latch | Syncronous S | Active Low | Active High | WUT Output |
| 4 | FF | Syncronous R | Rising Edge | Active Low | Programmable logic block Input |
| 5 | Latch | — | Active High | Active Low | Dynamic Select |

Flip-Flop Block Modes of Operation for an ORCA Series 2CA Programmable Logic Block The combinational output logic block 36, on the other hand, typically contains a multiplexer in order to connect different wire segments to the output of the programmable logic block. The programmable logic block 26 typically has no feedback loops and the flip-flop block 34 can be directly accessed by bypassing the memory block 32 (as shown in dashed lines in FIG. 5). Advantageously, the inputs and outputs of every module or block in this type of simple structure are easy to control and observe, thus facilitating nearly independent testing of the blocks.

In accordance with another important aspect of the inventive method, the PLBs under test 26 are completely tested in every possible mode of operation. To accomplish such a complete test, the PLBs under test 26 are repeatedly reconfigured and test patterns sufficient to detect all possible faults in the memory block 32, the flip-flop block 34, or the combinational output logic block 36 of the PLBs under test 26 are applied. More specifically, exhaustive testing is utilized to test each block of the PLBs under test 26 with sets of exhaustive test patterns. The sets of exhaustive test patterns are generated by the test pattern generator 22 and depend upon the mode of operation of the targeted block of the PLBs under test 26.

For example, a memory block 32 configured as a five variable LUT with 5 inputs (see Table 1, item 9) requires the test pattern generator 22 to generate a set of all possible thirty-two input test patterns. A memory block 32 configured as RAM, on the other hand, requires the test pattern generator 22 to generate only a set of standard RAM sequences which are known in the art to be exhaustive for typical RAM fault models. Such a set of typical RAM fault models include pattern-sensitive faults, for example.

Advantageously, this type of exhaustive testing of the blocks of the PLBs under test 26 results in maximum fault coverage without the need for explicit fault model assumptions. Therefore, the present method of testing the programmable logic blocks of an FPGA is certain to detect all faults including single stuck-at faults and multiple stuck-at faults in the PLBs under test 26 without the need for fault simulations. In general, the exhaustive methods of the present invention detect all faults which do not increase the number of states in the PLB under test 26, such as a bridging fault which introduces feedback. Although most faults which increase the number of states in the PLBs under test 26 are detected by the present method of testing, the detection of every such fault cannot be guaranteed.

In accordance with the preferred method of the present invention, the sets of exhaustive test patterns are first applied to the memory blocks 32 of the PLBs under test 26 bypassing the flip-flop blocks 34, then to the flip-flop blocks 34 bypassing the memory blocks 32, and finally to the paths 37 between the memory blocks 32 and the flip-flop blocks 34.

As noted above, the combinational output logic blocks 36 typically contains multiplexing logic for different connections between the outputs of the memory blocks 32 or the outputs of the flip-flop blocks 34, and the outputs of the PLBs under test 26. It should be appreciated that the different paths through the combinational logic output blocks can be tested in conjunction with either the memory blocks 32 or the flip-flop blocks 34.

Approaching the test in the above manner allows a defective block and its failing mode(s) of operation to be identified and any mode of operation that does not fail to be identified as fault-free. It is understood that the required number of configurations and the overall time involved in reconfiguring the blocks could be reduced by testing the memory block 32 and the flip-flop block 34 simultaneously. However, this would also reduce the diagnostic resolution of the test, and, as a result, the ability to provide on-line fault tolerant reconfiguration of the programmable logic blocks of the FPGA under test 10 would be limited. As described in detail in the above-noted pending patent application, providing fault tolerant reconfiguration for partially faulty programmable logic blocks allows for a more graceful degradation of the FPGA under test 10, thus extending the useful life of the FPGA under test and its associated hardware.

Another important aspect of the present inventive method is the repeated reconfiguring of the PLBs within the self-testing area 16 or self-testing tiles such that each PLB becomes the PLB under test 26 at least once, and preferably twice during testing. The functions of the PLBs within the self-testing area 16 or tile 20, i.e., test pattern generator, output response analyzer, PLB under test, and spare PLB if desired, are preferably systematically rotated. In this manner, each PLB is compared to at least two different PLBs during testing.

Figure 6D:
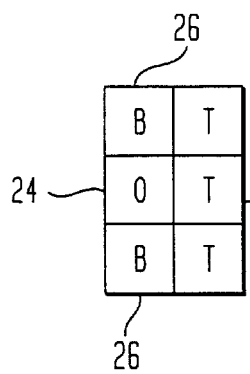
Figure 6E:
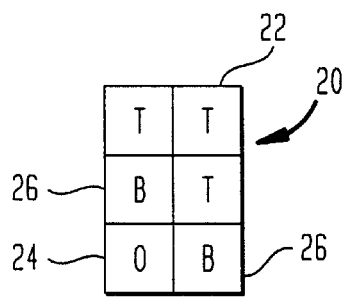
Figure 6F:
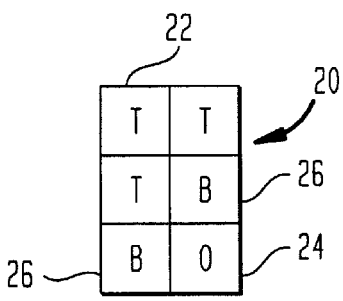

In accordance with the preferred embodiment of the present invention as noted above, the self-testing area 16 may be subdivided into several self-testing tiles which each include an even number of PLBs. More specifically, a typical self-testing tile 20 may include a group of PLBs configured to function as the TPG 22, a group of PLBs configured to function as the ORA 24, and the PLBs under test 26, respectively. As shown in FIGS. 6A–6C, for example, a typical TPG 22 may include a group of three PLBs (T), and single PLBs (O and B) may be configured to function as the ORA 24 and the PLBs under test 26. By systematically rotating the functions of the PLBs in the self-testing tile 20, as sequentially shown in FIGS. 6a–6f, each PLB becomes a PLB under test 26 exactly twice during the preferred method of testing. Advantageously, this repeating strategy allows the detection of both single faulty PLBs, as well as, several concurrently faulty PLBs. Rotating the functions of the PLBs in this manner insures that every PLB in the self-testing tile 20 is completely tested twice, each time being compared to a different PLB.

Figure 7:
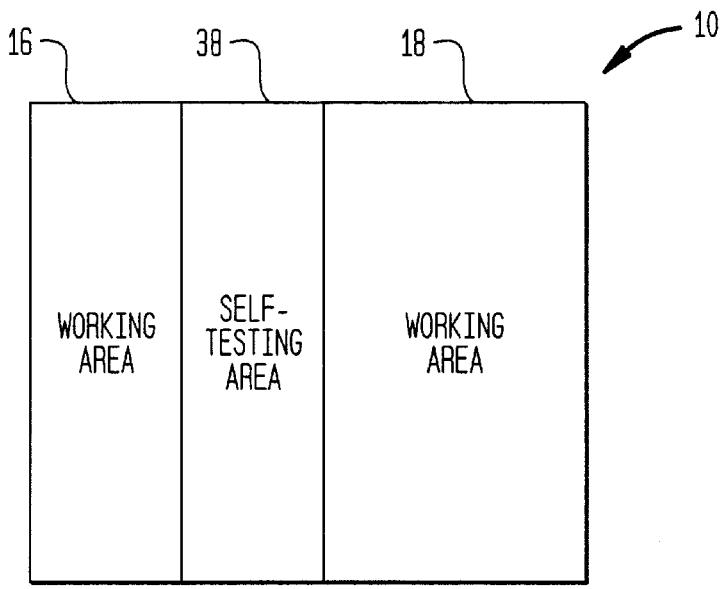
FIG. 7 is an illustration showing a portion of the working area reconfigured as a subsequent self-testing area and the initial self-testing area reconfigured as a portion of the working area.

Upon completion of testing of each of the programmable logic blocks located within the initial self-testing area 16, the FPGA under test 10 is reconfigured such that the functions of the PLBs forming a portion of the working area are copied to the PLBs forming the initial self-testing area 16. Once completed, the copied portion of the working area becomes a subsequent self-testing area 38 (shown in FIG. 7). Preferably, the initial self-testing area 16 is reconfigured as an adjacent portion of the working area 18, i.e., the programmed function of an adjacent portion of the working area 18 is relocated or more specifically, copied to the initial self-testing area 16, and the adjacent portion of the working area is reconfigured as the subsequent self-testing area 38.

In accordance with the present inventive method described above, the subsequent self-testing area 38 may similarly be divided into self-testing tiles 20, if desired. Further, the steps of testing and reconfiguring each programmable logic block within the subsequent testing area 38 for fault tolerant operation are then repeated. This continues until each portion of the working area 18, or the entire FPGA under test 10, is reconfigured as a subsequent self-testing area and its PLBs tested and reconfigured if required. In other words, the self-testing area continuously roves around the FPGA under test 10 repeating the steps of testing and reconfiguring the programmable logic blocks so long as the FPGA is in operation. Advantageously, normal operation of the FPGA under test 10 continues uninterrupted by the testing conducted within the self-testing areas.

Figure 8A:
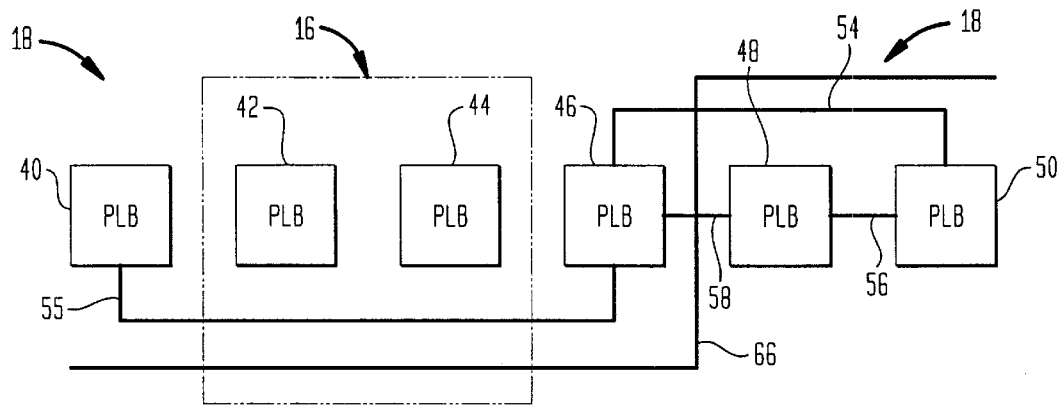
FIGS. 8A–8C are schematic block diagrams of a row of programmable logic blocks sequentially showing the reconfiguration steps when no faulty programmable logic blocks are detected during testing.
Figure 8B:
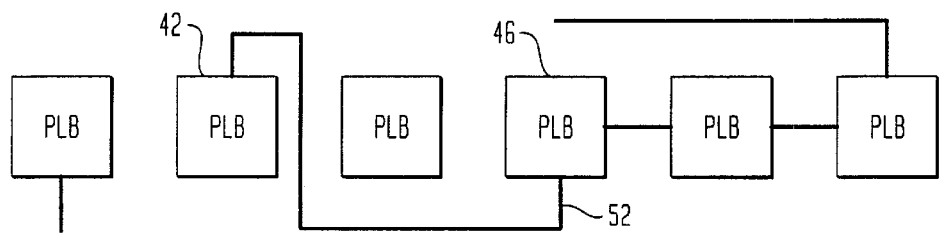
Figure 8C:
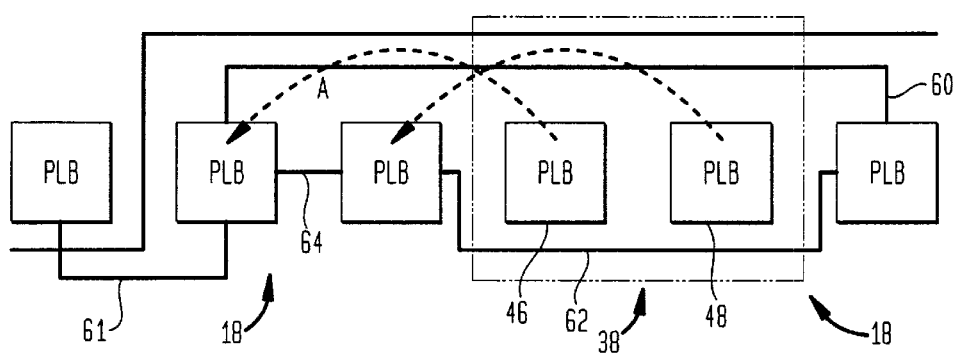

The present preferred method of roving the self-testing area 16 or reconfiguring the FPGA under test 10 is sequentially illustrated in FIGS. 8A–8C for the case where no faulty PLBs are detected. Specifically, FIG. 8A shows a row of six PLBs 40, 42, 44, 46, 48, and 50 within the FPGA under test 10 wherein PLBs 40, 46, 48, and 50 located within the working area 18 are separated by PLBs 42 and 44 of the initial self-testing area 16. In accordance with the present inventive method described above, the test and reconfiguration controller 12 first momentarily stops the system clock and copies the present state values of the working area PLBs 46 and 48 to the new working area PLBs 42 and 44, if necessary. Of course, this additional step is only necessary if the PLBs 46 and 48 are used as registers and/or RAM.

Copying the present state values is not required for PLBs used only as combinational functions.

As will be apparent to those skilled in the art, the manner in which the present state values are transferred depends on the features of the selected FPGA under test 10. For example, an FPGA such as an XC6200 provides direct reading and writing of registers by treating them as addressable memory locations. Although a little more complicated, solutions based on partial configuration readback, available on ORCA series 3C FPGAs, are similarly easy to implement. For FPGAs without such features, however, an additional configuration of the FPGA under test 10 is required to create temporary transfer paths through the initial self-testing area 16 from source PLBs to destination PLBs. FIG. 8B illustrates such a temporary transfer path 52 created to transfer present state values from working area PLB 46 to initial self-testing area PLB 42. A single system clock pulse allows the present state values to be copied.

In addition to a transfer path 52, copying RAM contents requires the additional creation of a transfer controller (not shown) to sequence both the source RAM configured PLB and the destination RAM configured PLB concurrently through their address space, and to issue the proper read and write signals for the desired transfer. Preferably, the transfer controller is configured in any known manner utilizing PLBs and the necessary interconnect resources located within the initial self-testing area 16 which are not involved in the current step.

Once the present state values of the working area PLBs 46 and 48 are copied to the new working area PLBs 42 and 44, where necessary, the test and reconfiguration controller 12 reconfigures PLBs 42 and 44 with the identical functions or modes of operation of PLBs 46 and 48 (shown illustratively by arrows A in FIG. 8C), and the associated programmable routing resources to maintain the correct interconnections. For example, working area PLB interconnections 54, 55, 56, and 58 (shown in FIG. 8A) are now working area PLB interconnections 60, 61, 62 and 64 (shown in FIG. 8C), respectively. In addition, PLBs 46 and 48 in the subsequent testing area 38 now have no working area interconnections. In accordance with the preferred embodiment of the present inventive method, the necessary reconfiguration of the programmable routing network interconnections noted above is accomplished using a standard router in an incremental mode. Of course, other methods of incremental routing known in the art may similarly be utilized.

Once the new working area PLBs 42 and 44 are reconfigured with the functions of PLBs 46 and 48 and the correct programmable routing network interconnections made, the test and reconfiguration controller 12 restarts the system clock and configures the subsequent self-testing area 38 to restart testing.

For a full left to right horizontal swap the process must be repeated N/2 times. Thus, for the entire FPGA under test 10, N/2 incremental routing jobs are required. It should be appreciated that the computation of the configurations needed for reconfiguring the self-testing areas is not done on-line, but as a preprocessing step; hence the cost of the incremental routing jobs is acceptable.

If an incremental routing job is unable to be completed, the original FPGA configuration is unable to implement roving and the netlist is rerouted after reserving several segments in the congested area. In this way, the program that computes the configurations for reconfiguring the self-testing areas acts as an audit of the circuit layout, and introduces a limited amount of overhead only when the original layout precludes reconfiguring the self-testing areas.

Alternatively, specialized algorithms may be based upon ones proposed to N. R. Mahopatra and S. Dutt, entitled Efficient Network-Flow Based Techniques for Dynamic Fault Reconfiguration in FPGA's, Proc. $29^{th}$ Fault-Tolerant Computing Symp., pp. 122–129, 1999. While these algorithms may be more efficient, the processing time savings is of little concern because the computations are done as a pre-processing step.

In summary, the method of testing field programmable gate arrays in fault tolerant applications is carried out during normal on-line operation of the FPGA by configuring the FPGA resources into a working area and an initial self-testing area. The working area maintains normal operation of the FPGA throughout testing. Within the initial and subsequent self-testing areas, however, the programmable logic blocks are each tested, and their utilization adjusted, if required. Advantageously, the working area is substantially unaffected by testing, and testing time constraints are reduced since normal operation continues in the working area.

The foregoing description of a preferred embodiment of the present invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of testing programmable logic blocks of a field programmable gate array during normal on-line operation comprising the steps of:

configuring said field programmable gate array into an initial self-testing area and a working area, said working area maintaining normal operation of the field programmable gate array;

testing said programmable logic blocks located within said self-testing area;

roving said initial self-testing area by reconfiguring said field programmable gate array such that a portion of said working area becomes a subsequent self-testing area and at least a portion of said initial self-testing area becomes a portion of said working area.

2. The method set forth in claim 1, wherein the steps of testing and roving are repeated until each portion of said working area is reconfigured as a subsequent self-testing area and tested.

3. The method set forth in claim 1 further comprising the step of reconfiguring the utilization of said tested programmable logic blocks dependent upon results of said testing step for fault tolerant operation of said working area and subsequent self-testing areas, whereby partially faulty programmable logic blocks may be further utilized.

4. The method set forth in claim 1, wherein the step of testing said programmable logic blocks located within said self-testing area includes establishing the programmable logic blocks within said self-testing area to function as a test pattern generator, an output response analyzer, and equivalently configured programmable logic blocks under test.

5. The method set forth in claim 4, wherein the step of testing said programmable logic blocks located within said self-testing area further includes applying test patterns generated by said test pattern generator to said programmable logic blocks under test;
   comparing outputs of said programmable logic blocks under test by said output response analyzer; and
   producing fault status data for said programmable logic blocks under test.

6. The method set forth in claim 5, wherein said test patterns are exhaustive and sufficient to detect all possible faults in said programmable logic blocks under test.

7. The method set forth in claim 6 further comprising the step of detecting the presence of any faulty modules or modes of operation of said programmable logic blocks under test.

8. The method set forth in claim 7 further comprising the step of identifying said faulty modules or modes of operation of said programmable logic blocks under test to enable on-line fault tolerant reconfiguration.

9. The method set forth in claim 5, further comprising the step of repeatedly reconfiguring said programmable logic blocks under test in order to test said programmable logic blocks under test completely in all possible modes of operation.

10. The method set forth in claim 5 further comprising the step of repeatedly reconfiguring said programmable logic blocks within said self-testing area so each programmable logic block becomes one of said programmable logic blocks under test at least once during testing.

11. The method set forth in claim 10, wherein the step of repeatedly reconfiguring said programmable logic blocks within said self-testing area includes the step of systematically rotating the functions of said programmable logic blocks so that each programmable logic block is compared to at least two different programmable logic blocks.

12. The method set forth in claim 1, wherein said configuring step further includes dividing said self-testing area including said programmable logic blocks into at least two tiles for concurrent testing.

13. The method set forth in claim 12, wherein the step of testing said programmable logic blocks located within said at least two tiles includes establishing the programmable logic blocks in each of said tiles to function as a test pattern generator, an output response analyzer, and equivalently configured programmable logic blocks under test.

14. The method set forth in claim 13, wherein the step of testing said programmable logic blocks located within said at least two tiles further includes applying test patterns generated by said test pattern generator to said programmable logic blocks under test in each tile;
   comparing outputs of said programmable logic blocks under test by said output response analyzer in each tile; and
   producing fault status data for said programmable logic blocks under test in each tile.

15. The method set forth in claim 14, further comprising the step of repeatedly reconfiguring said programmable logic blocks under test in each tile in order to test said programmable logic blocks under test completely in all possible modes of operation.

16. The method set forth in claim 15 further comprising the step of detecting the presence of any faulty modules or modes of operation of said programmable logic blocks under test in each tile.

17. The method set forth in claim 16 further comprising the step of identifying said faulty modules or modes of operation of said programmable logic blocks under test in each tile to enable on-line fault tolerant reconfiguration.

18. The method set forth in claim 14, wherein said test patterns are exhaustive and sufficient to detect all possible faults in said programmable logic blocks under test in each tile.

19. The method set forth in claim 14 further comprising the step of repeatedly reconfiguring said programmable logic blocks within each tile so each programmable logic block becomes one of said programmable logic blocks under test at least once during testing.

20. The method set forth in claim 19, wherein the step of repeatedly reconfiguring said programmable logic blocks within each tile includes the step of systematically rotating the functions of said programmable logic blocks so that each programmable logic block is compared to at least two different programmable logic blocks within each tile.

21. A method of on-line testing a field programmable gate array including programmable logic blocks comprising the steps of:
   configuring said field programmable gate array into initial self-testing areas and a working area, said working area maintaining normal operation of the field programmable gate array;
   testing said programmable logic blocks located within said self-testing areas;
   roving said self-testing areas by reconfiguring a portion of said working area as subsequent self-testing areas and at least a portion of said initial self-testing areas as a portion of said working area.

22. The method set forth in claim 21 further comprising the step of reconfiguring the utilization of said tested programmable logic blocks dependent upon results of said testing step for fault tolerant operation in said working area and subsequent self-testing areas.

23. The method set forth in claim 21, wherein the step of testing said programmable logic blocks located within said self-testing areas further includes applying test patterns generated by a test pattern generator to selected programmable logic blocks under test;
   comparing outputs of said selected programmable logic blocks under test by an output response analyzer; and
   producing fault status data for said programmable logic blocks.

24. The method set forth in claim 23 further comprising the step of repeatedly reconfiguring said programmable logic blocks within said self-testing areas so each programmable logic block becomes a programmable logic block under test during testing.

25. The method set forth in claim 24, wherein the step of repeatedly reconfiguring said programmable logic blocks within said self-testing areas includes the step of systematically rotating the functions of said programmable logic blocks so that each programmable logic block is compared to at least two different programmable logic blocks.

26. An apparatus for testing programmable logic blocks during normal on-line operation of a field programmable gate array comprising:
   a controller in communication with said field programmable gate array (a) for configuring said field programmable gate array into an initial self-testing area and a working area, said working area maintaining normal operation of the field programmable gate array (b) for testing said programmable logic blocks located within said self-testing area, and (c) roving said self-testing area by reconfiguring said field programmable gate array such that a portion of said working area becomes a subsequent self-testing area and at least a portion of said initial self-testing area becomes a portion of said working area; and a storage medium in communication with said controller for storing a plurality of test configurations, and usage and fault status data for each programmable logic block under test.

27. A field programmable gate array comprising:

a plurality of programmable logic blocks;

a plurality of programmable routing resources interconnecting said programmable logic blocks;

a plurality of input/output cells;

said programmable logic blocks and said programmable routing resources being initially configured as an initial self-testing area for testing a portion of said programmable logic blocks within said initial self-testing area, and an initial working area for maintaining normal on-line operation of the field programmable gate array during testing; and said programmable logic blocks and said programmable routing resources being subsequently configured as a subsequent self-testing area for testing a different portion of the programmable logic blocks within said subsequent self-testing area, and a subsequent working area for maintaining normal on-line operation of the field programmable gate array during subsequent testing.

28. The field programmable gate array of claim 27, wherein said programmable logic blocks within said initial self-testing area are configured to function as a test pattern generator, an output response analyzer, and equivalently configured programmable logic blocks under test.

29. The field programmable gate array of claim 28, wherein said test pattern generator generates an exhaustive set of test patterns for testing said programmable logic blocks under test; and said output response analyzer compares outputs of said programmable logic blocks under test and produces fault status data for said programmable logic blocks under test.

* * * * *